(12) United States Patent
Sim et al.

(10) Patent No.: US 11,062,885 B2
(45) Date of Patent: Jul. 13, 2021

(54) SUPPORTING UNIT AND SUBSTRATE TREATING APPARATUS INCLUDING THE SAME

(71) Applicant: SEMES CO., LTD., Cheonan-si (KR)

(72) Inventors: Jinwoo Sim, Seoul (KR); Hyung Joon Kim, Pyeongtaek-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 214 days.

(21) Appl. No.: 15/967,736

(22) Filed: May 1, 2018

(65) Prior Publication Data

US 2018/0330925 A1 Nov. 15, 2018

(30) Foreign Application Priority Data

May 12, 2017 (KR) ........................ 10-2017-0059004

(51) Int. Cl.
*H01J 37/32* (2006.01)

(52) U.S. Cl.
CPC .... *H01J 37/32642* (2013.01); *H01J 37/3244* (2013.01); *H01J 37/32724* (2013.01); *H01J 2237/002* (2013.01)

(58) Field of Classification Search
None
See application file for complete search history.

(56) References Cited

U.S. PATENT DOCUMENTS

| 2001/0015262 A1* | 8/2001 | Denpoh | H01J 37/32642 |
| | | | 156/345.37 |
| 2015/0373783 A1* | 12/2015 | Kitagawa | H01L 21/6831 |
| | | | 156/345.52 |
| 2016/0189994 A1 | 6/2016 | Sasaki et al. | |
| 2016/0300698 A1 | 10/2016 | Tanaka et al. | |

FOREIGN PATENT DOCUMENTS

| JP | 2012-146743 A | 8/2012 |
| JP | 2013232680 A | 11/2013 |
| JP | 2014072355 A | 4/2014 |
| JP | 2016-127170 A | 7/2016 |
| KR | 20100005683 A | 1/2010 |
| TW | 201438139 A | 10/2014 |
| TW | 201614708 A | 4/2016 |

* cited by examiner

*Primary Examiner* — Jethro M. Pence
(74) *Attorney, Agent, or Firm* — Harness, Dickey & Pierce, P.L.C.

(57) ABSTRACT

An apparatus for treating a substrate comprises a chamber having a treatment space for treating the substrate; a supporting unit which supports the substrate, inside the treatment space; a gas supplying unit which supplies process gas into the treatment space; and a plasma source which generates plasma based on the process gas inside the treatment space. The supporting unit comprises a supporting plate on which the substrate is placed; a focus ring which is disposed to surround the substrate supported by the supporting plate; a temperature control unit which adjusts a temperature of the focus ring. The temperature control unit may include a first heater which is disposed to heat the focus ring under the focus ring and to be opposite to the focus ring; and a cooling member which is provided under the first heater.

11 Claims, 4 Drawing Sheets

SUPPORTING UNIT AND SUBSTRATE TREATING APPARATUS INCLUDING THE SAME

CROSS-REFERENCE TO RELATED APPLICATIONS

This application claims priority under 35 U.S.C. § 119 to Korean Patent Application No. 10-2017-0059004 filed on May 12, 2017, in the Korean Intellectual Property Office, the disclosures of which are incorporated by reference herein in their entireties.

BACKGROUND

Embodiments of the inventive concept described herein relate to supporting units and substrate treating apparatuses including the same.

In order to fabricate a semiconductor device, a desired pattern is formed on a substrate through various processes such as, photolithography, etching, ashing, ion implantation, and thin film deposition, and cleaning processes. Among them, the etching process, which is to remove a selected heating region from a layer formed on a substrate, includes a wet etching process and a dry etching process.

Among them, an etching device using plasma is used for the dry etching process. In general, an electromagnetic field is formed in an inner space of a chamber to form the plasma. The electromagnetic field excites process gas provided in the chamber to be in a plasma status.

The plasma refers to the status of gas ionized while including ions, electrons and radicals. The plasma is generated due to a significantly high temperature, a strong electric field, or radio frequency electromagnetic fields. The fabrication process of a semiconductor includes an etching process using the plasma. The etching process is performed as ion particles, which are contained in the plasma, collide with a substrate.

Figure 1:
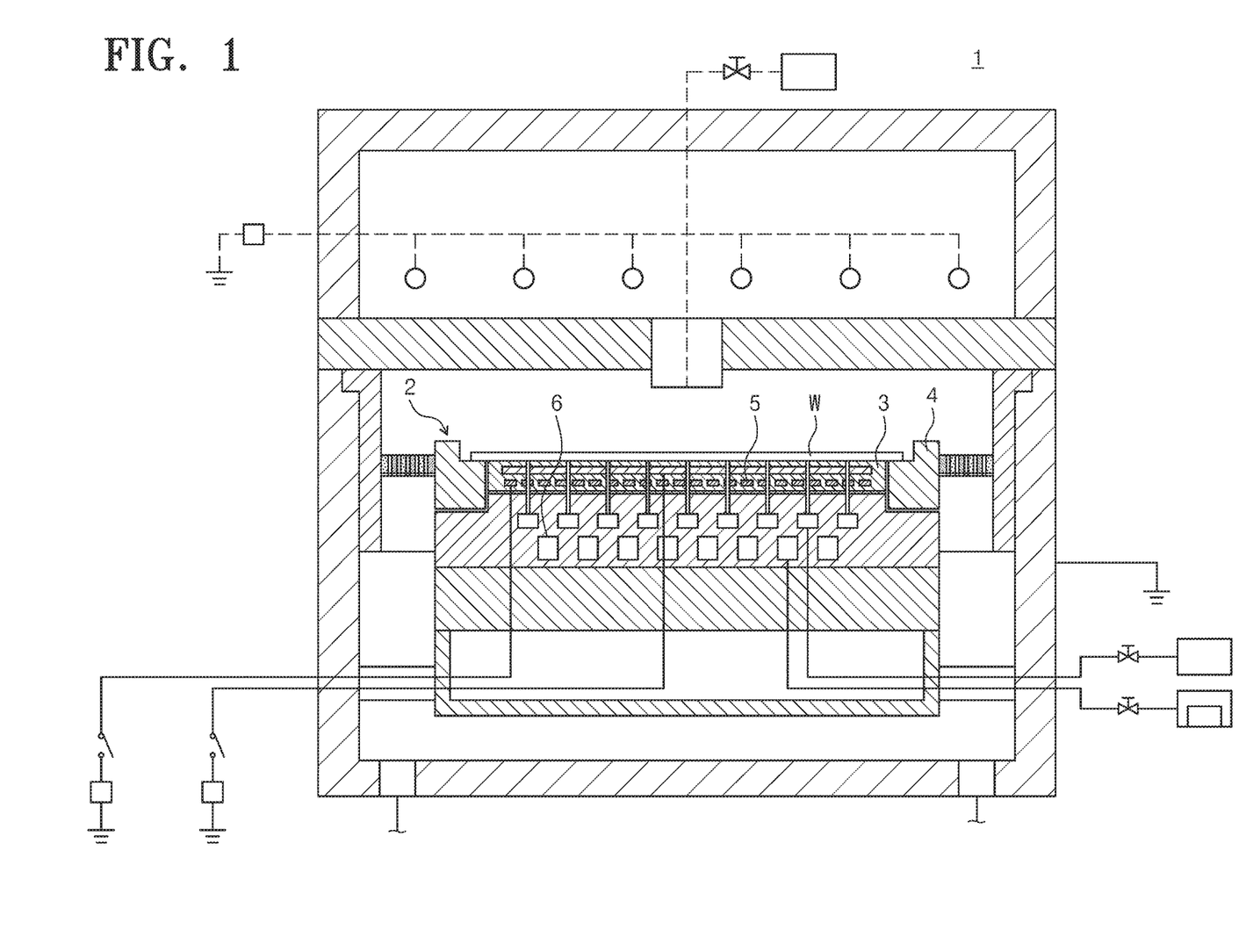
FIG. 1 is a sectional view illustrating a typical substrate treating apparatus.

FIG. 1 is a sectional view illustrating a substrate treating apparatus 1. Referring to FIG. 1, typically, a supporting unit 2, which supports a substrate "W" inside the substrate supporting apparatus 1 performing the etching process with respect to the substrate "W" by using plasma, includes a supporting plate 3, on which the substrate is placed, and a focus ring 4 arranged along the circumference of the supporting plate 3 and supporting an edge region of the substrate "W". In general, a heater 5 and a cooling member 6 which adjust the temperature of the supporting plate 3 are provided to the supporting unit 2, but an element adjusting the temperature of the focus ring 4 is not provided to the supporting unit 2. In general, although the temperature of the focus ring 4 is adjusted by simply making contact with the supporting plate 3, it may be difficult to appropriately adjust the temperature of the focus ring 4 only through the simple contact with the supporting plate 3.

SUMMARY

Embodiments of the inventive concept provide apparatuses capable of precisely adjusting the temperature of a focus ring.

Embodiments of the inventive concept provide apparatuses capable of uniformly treating a substrate.

Embodiments of the inventive concept provide apparatuses capable of enhancing the reproducibility of a process for a substrate.

The inventive concept provides a substrate treating apparatus for treating a substrate. According to an exemplary embodiment of the inventive concept, a chamber having a treatment space for treating the substrate; a supporting unit which supports the substrate, inside the treatment space; a gas supplying unit which supplies process gas into the treatment space; and a plasma source which generates plasma based on the process gas inside the treatment space. The supporting unit comprises: a supporting plate on which the substrate is placed; a focus ring which is disposed to surround the substrate supported by the supporting plate; and a temperature control unit which adjusts a temperature of the focus ring. The temperature control unit comprises: a first heater which is disposed to heat the focus ring under the focus ring and to be opposite to the focus ring; a second heater which is installed at a position opposite to the first heater under the first heater; and a cooling member which is provided under the second heater.

The supporting unit may further comprise a body positioned in a ring shape under the focus ring, and the cooling member may be provided inside the body.

The first heater and the second heater may be provided in the body.

The supporting unit may further comprise a heat transfer sheet interposed between the focus ring and the body and having a heat transfer rate higher than the heat transfer rate of the body.

The supporting unit may further comprise a heat transfer sheet guard which surrounds an inner surface and an outer surface of the heat transfer sheet.

The heat transfer sheet guard may be provided integrally with the body.

According to an exemplary embodiment, the focus ring may have a bottom surface stepped to make a difference in height between an inner region and an outer region of the bottom surface, a top surface of the body may be stepped to be engaged with the bottom surface of the focus ring.

The heat transfer sheet guard may comprise: an inner guard which surrounds an inner surface and an outer surface of the inner sheet; and an outer guard which surrounds an inner surface and an outer surface of the outer sheet.

The temperature control unit may comprise: a temperature measuring member which measures the temperature of the focus ring; and a controller which controls the first heater, the second heater, and the cooling member depending on the temperature measured by the temperature measuring member.

The controller may increase a temperature of the first heater, increase a temperature of the cooling member, and increase a temperature of the second heater when the temperature of the focus ring, which is measured by the temperature measuring member, is less than a specific temperature range. The controller may decrease the temperature of the first heater, decrease the temperature of the cooling member, and decrease the temperature of the second heater, when the temperature of the focus ring measured by the temperature measuring member exceeds the specific temperature range.

The focus ring may comprise at least one of silicon (Si), silicon carbide (SiC), quartz, yttrium oxide ($Y_2O_3$), and the body may at least one of quartz, yttrium oxide ($Y_2O_3$), and alumina ($Al_2O_3$).

In addition, the inventive concept provides a supporting unit for supporting a substrate in a treatment space for treating the substrate. According to an exemplary embodiment of the inventive concept, the supporting unit comprises a supporting plate on which the substrate is placed; a focus ring which is disposed to surround the substrate supported by the supporting plate; and a temperature control unit which adjusts a temperature of the focus ring. The temperature control unit comprises a first heater which is disposed to heat the focus ring under the focus ring and to be opposite to the focus ring; a second heater which is installed at a position opposite to the first heater under the first heater; and a cooling member which provided under the second heater.

The supporting unit may further comprise a body positioned in a ring shape under the focus ring, and the cooling member may be provided inside the body.

The first heater and the second heater may be provided in the body.

The supporting unit may further comprise a heat transfer sheet interposed between the focus ring and the body and having a heat transfer rate higher than the heat transfer rate of the body.

The supporting unit may further comprise a heat transfer sheet guard which surrounds an inner surface and an outer surface of the heat transfer sheet.

The supporting unit may further comprise a supporting plate heating member which heats the supporting plate.

The supporting plate may comprise: an electrostatic chuck having a top surface on which the substrate is placed; and a lower body provided under the electrostatic chuck and having a cooling line having a cooling fluid flowing therein.

The cooling member may comprise a cooling fluid passage having the cooling fluid flowing therein and formed in the body.

The temperature control unit may comprise a temperature measuring member which measures the temperature of the focus ring; and a controller which controls the first heater, the second heater, and the cooling member depending on the temperature measured by the temperature measuring member.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Hereinafter, an embodiment of the inventive concept will be described in more detail with reference to the accompanying drawings. The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

Hereinafter, a substrate treating apparatus etching a substrate by using plasma will be described according to an embodiment of the inventive concept. However, the inventive concept is not limited thereto, but is applicable to various devices having a focus ring for supporting an edge region of the substrate while surrounding a supporting plate on which the substrate is placed.

In addition, according to an embodiment of the inventive concept, an electrostatic chuck will be described as example of the supporting unit. However, the inventive concept is not limited, but the supporting unit may support the substrate through mechanical clapping or vacuum.

Figure 2:
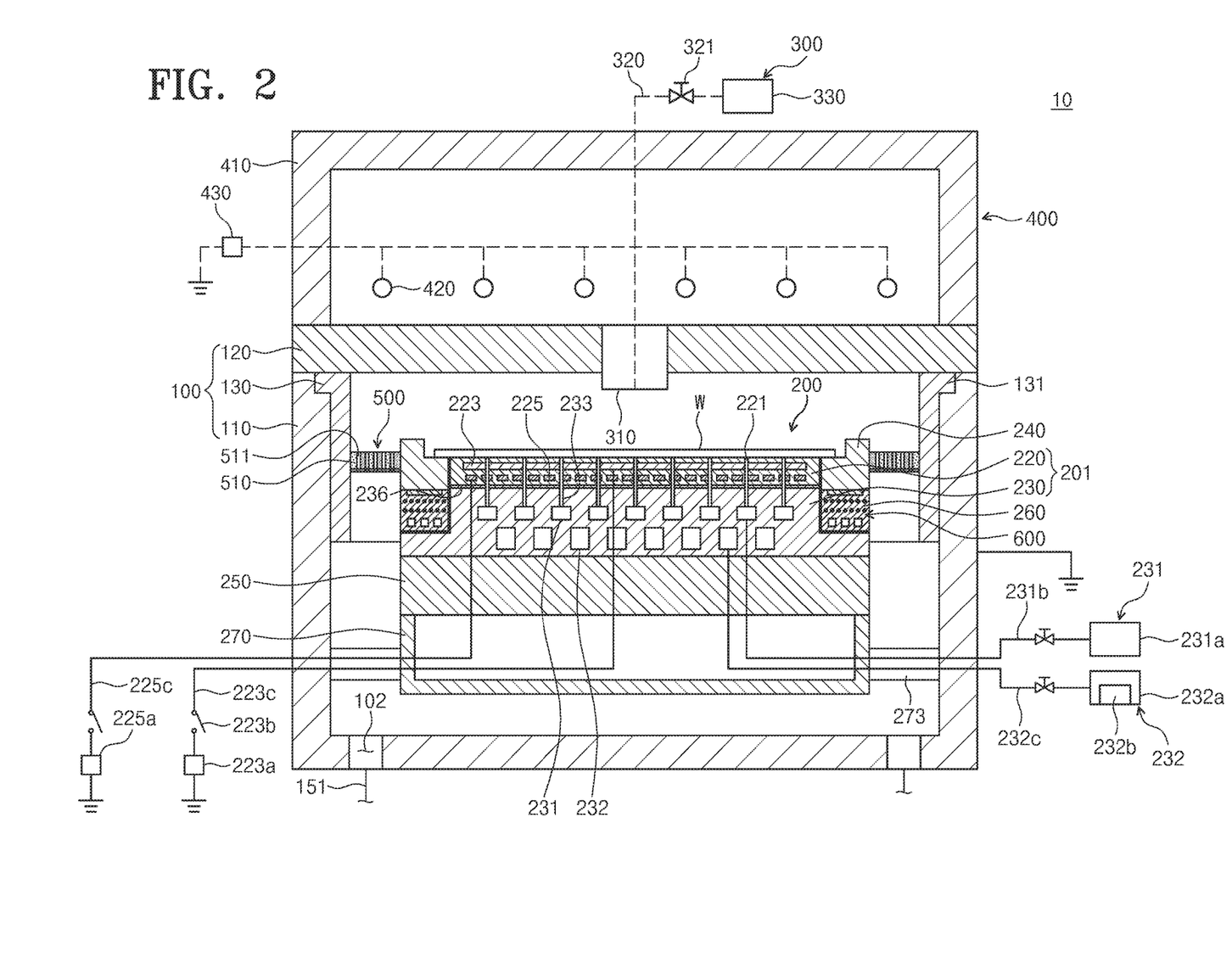
FIG. 2 is a sectional view illustrating a substrate treating apparatus, according to an embodiment of the inventive concept.
Figure 3:
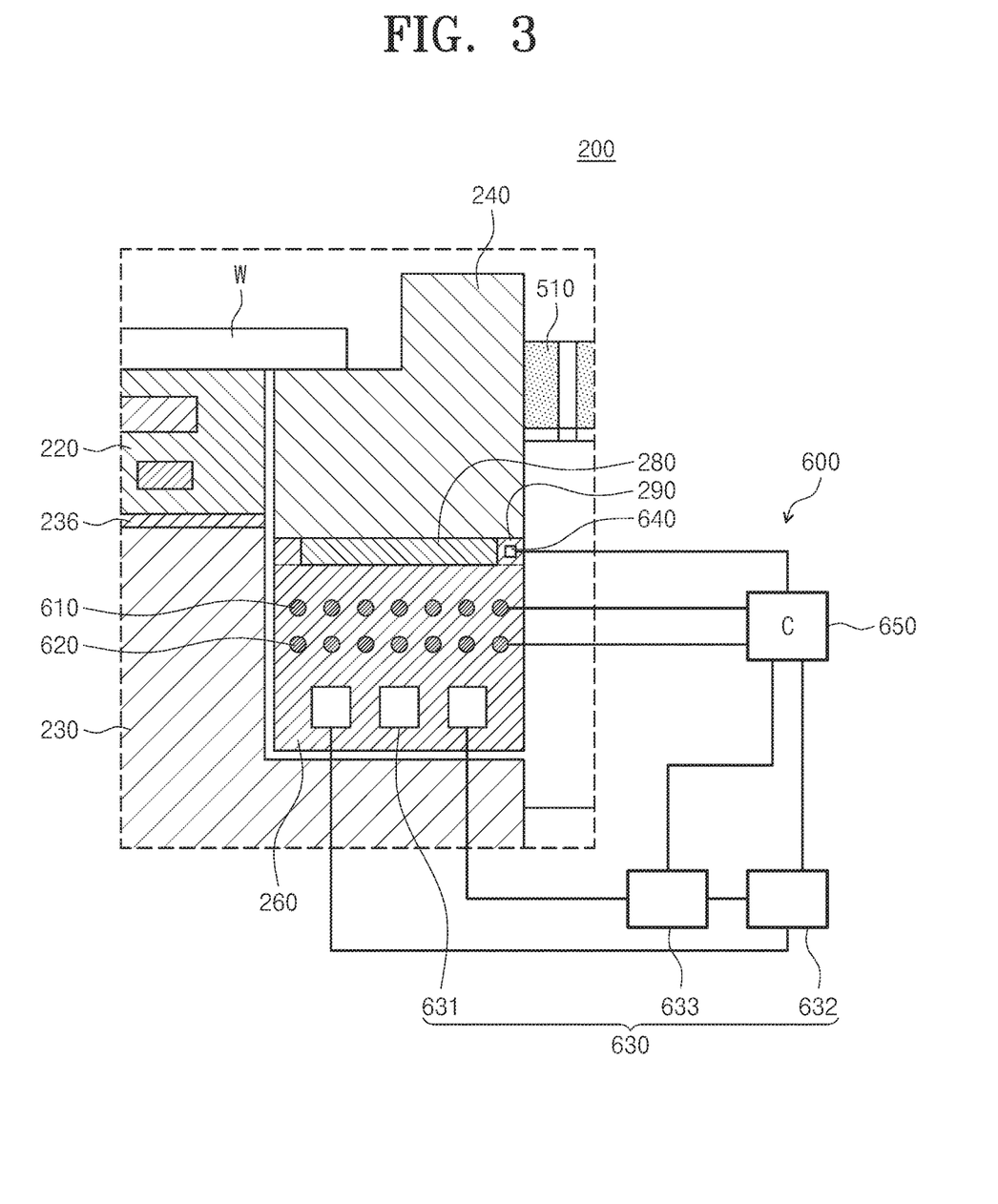
FIG. 3 is a sectional view illustrating a part of a supporting unit of FIG. 2.

FIG. 2 is a sectional view illustrating a substrate treating apparatus, according to an embodiment of the inventive concept. FIG. 3 is a sectional view illustrating a part of a supporting unit 200 of FIG. 2. Referring to FIGS. 2 and 3, the substrate treating apparatus 10 treats a substrate "W" by using plasma. For example, the substrate treating apparatus 10 may perform an etching process with respect to the substrate "W". The substrate treating apparatus 10 includes a chamber 100, the supporting unit 200, a gas supplying unit 300, a plasma source 400, and an exhaust unit 500.

The chamber 100 has a treatment space for treating the substrate "W". The chamber 100 includes a housing 110, a cover 120, and a liner 130.

The housing 110 has an inner space having an open top surface. The inner space of the housing 110 is provided as a treatment space for performing a substrate treating process. The housing 110 include metal. The housing 110 may include aluminum (Al). The housing 110 may be grounded. The housing 110 is formed in the bottom surface thereof with an exhaust hole 102. The exhaust hole 102 is connected with an exhaust line 151. The reaction by-products resulting from the process and the gas staying in the inner space of the housing 110 may be discharged to the outside through the exhaust line 151. The internal pressure of the housing 110 is reduced to a specific pressure by the exhaust process.

The cover 120 covers the open top surface of the housing 110. The cover 120 is provided in a plate shape to seal the inner space of the housing 110. The cover 120 may include a dielectric substance window The liner 130 is provided inside the housing 110. The liner 130 has an inner space having open top and bottom surfaces. The liner 130 may be provided in a cylinder shape. The liner 130 may have a radius corresponding to the inner side surface of the housing 110. The liner 130 is provided along the inner side surface of the housing 110. A supporting ring 131 is formed on an upper end of the liner 130. The supporting ring 131 is provided in a ring-shaped plate and protrudes outward from the liner 130 along the circumference of the liner 130. The supporting ring 131 is placed on the upper end of the housing 110 to support the liner 130. The liner 130 may include the same material as that of the housing 110. The liner 130 may include Al. The liner 130 protects the inner side surface of the housing 110. When the process gas is transformed to plasma, arc may be discharged inside the chamber 100. The arc discharge may damage peripheral devices. The liner 130 protects the inner side surface of the housing 110 to prevent the inner side surface of the housing 110 from being damaged due to the arc discharge. In addition, the reaction by-products produced during the substrate treating process are prevented from being deposited on an inner wall of the housing 110. The liner 130 requires a lower cost and is more easily replaced with new one when comparing with the housing 110. Accordingly, when the liner 130 is damaged due to the arc discharge, a worker may replace the liner 130 with new one.

The supporting unit 200 supports the substrate "W" inside the treatment space inside the chamber 100. For example, the supporting unit 200 is provided inside the housing 110 of the chamber 100. The supporting unit 200 supports the substrate "W". The supporting unit 200 may include an electrostatic chuck adsorbing the substrate "W" by using electrostatic force. Alternatively, the supporting unit 200 may support the substrate "W" in various manners such as mechanical clamping. Hereinafter, the supporting unit 200 including the electrostatic chuck will be described.

According to an embodiment, the supporting unit 200 includes a supporting plate 201, a focus ring 240, a temperature control unit 600, and a body 260. The supporting unit 200 may be spaced apart from the bottom surface of the housing 110 inside the housing 110.

The supporting plate 201 includes an electrostatic chuck 220, an electrode 223, a lower body 230, an insulating plate 250, and a lower cover 270. The substrate "W" is placed on the supporting plate 201.

The electrostatic chuck 220 is positioned on an upper end portion of the supporting plate 201. The electrostatic chuck 220 may include a dielectric substance having a disc shape. The substrate "W" is placed on the top surface of the electrostatic chuck 220. The top surface of the electrostatic chuck 220 has a diameter smaller than that of the substrate "W". The electrostatic chuck 220 is formed therein with a first supply fluid passage 221 serving as a passage for supplying a heat transfer gas to the bottom surface of the substrate "W". The electrode 223 is buried in the electrostatic chuck 220.

The electrode 223 is electrically connected with a first lower power source 223a. Electrostatic force acts between the electrode 223 and the substrate "W" by a current applied to the electrode 223 and the substrate "W" is adsorbed to the electrostatic chuck 220 by the electrostatic force.

The supporting unit 200 may further include a supporting plate heating member 225. The supporting plate heating member 225 heats the supporting plate 201. The supporting plate heating member 225 is positioned under the electrode 223. The supporting plate heating member 225 is electrically connected with a second lower power source 225a. The supporting plate heating member 225 resists a current applied thereto from the second lower power source 225a, thereby generating heat. The generated heat is transferred to the substrate "W" through the electrostatic chuck 220. The substrate "W" is maintained at a specific temperature by the heat generated from the supporting plate heating member 225. The supporting plate heating member 225 includes a spiral-shaped coil. The lower body 230 is positioned under the electrostatic chuck 220. The bottom surface of the electrostatic chuck 220 may be bonded to the top surface of the lower body 230 by an adhesive 236.

The lower body 230 is formed therein with a first circulation fluid passage 231, a second circulation fluid passage 232, and a second supply fluid passage 233. The first circulation fluid passage 231 serves as a passage through which the heat transfer gas circulates. The second circulation fluid passage 232 serves as a passage through which a cooling fluid circulates. The second supply fluid passage 233 allows the first circulation fluid passage 231 to communicate with the first supply fluid passage 221. The first circulation fluid passage 231 serves as a passage through which the heat transfer gas circulates. The first circulation fluid passage 231 may be formed in a spiral shape inside the lower body 230. Alternatively, the first circulation fluid passage 231 may include ring-shaped fluid passages concentrically arranged with mutually different radiuses. First circulation fluid passages 231 may communicate with each other. The first circulation fluid passages 231 are formed at equal heights.

The first circulation fluid passage 231 is connected with a heat transfer medium storing unit 231a through a heat transfer medium supplying line 231b. A heat transfer medium is stored in the heat transfer medium storing unit 231a. The heat transfer medium includes inert gas. According to an embodiment, the heat transfer medium includes helium (He) gas. The helium (He) gas is supplied to the first circulation fluid passage 231 through the heat transfer medium supplying line 231b, and is supplied to the bottom surface of the substrate "W" by sequentially passing through the second supply fluid passage 233 and the first supply fluid passage 221. The helium (He) gas serves as a medium helping the heat transfer between the substrate "W" and the electrostatic chuck 220.

The second circulation fluid passage 232 may serve as a cooling line having a cooling fluid flowing therein. According to an embodiment, the second circulation fluid passage 232 is connected with a cooling fluid storing unit 232a through a cooling fluid supplying line 232c. The cooling fluid is stored in the cooling fluid storing unit 232a. A cooler 232b may be provided inside the cooling fluid storing unit 232a. The cooler 232b cools the cooling fluid to a specific temperature. Alternatively, the cooler 232b may be installed on the cooling fluid supplying line 232c. The cooling fluid received in the second circulation fluid passage 232 through the cooling fluid supplying line 232c circulates along the second circulation fluid passage 232 to cool the lower body 230. The lower body 230 is cooled while cooling the electrostatic chuck 220 and the substrate "W" together, thereby maintaining the substrate "W" to the specific temperature.

The focus ring 240 is provided at an edge region of the supporting plate 201 to surround the substrate "W" supported by the supporting plate 201. According to an embodiment, the focus ring 240 has a ring shape, and is arranged along the circumference of the electrostatic chuck 220 to support the edge region of the substrate "W". The focus ring 240 may be provided to have an edge region protruding in the shape of a ring such that plasma is concentrated onto the substrate "W". The focus ring 240 may include a dielectric material including at least one of silicone (Si), silicon carbide (SiC), quartz, yttrium oxide ($Y_2O_3$), and alumina ($Al_2O_3$). For example, the focus ring 240 may include any one of silicone (Si), silicon carbide (SiC), quartz, yttrium oxide ($Y_2O_3$), and alumina ($Al_2O_3$).

The insulating plate 250 is positioned under the lower body 230. The insulating plate 250 includes an insulating material to insulate the lower body 230 from the lower cover 270.

The lower cover 270 is positioned at the lower end of the supporting unit 200. The lower cover 270 may be spaced apart from the bottom surface of the housing 110. The lower cover 270 has an inner space having an open top surface. The top surface of the lower cover 270 is covered by the insulating plate 250. Accordingly, the outer diameter of the sectional surface of the lower cover 270 may be equal to the outer diameter of the insulating plate 250. A lift pin module (not illustrated) may be positioned in the inner space of the lower cover 270 such that the carried substrate "W" is moved to the electrostatic chuck 220 from a carrying member provided in the outside.

The lower cover 270 has a connection member 273. The connection member 273 connects an outer side surface of the lower cover 270 with an inner wall of the housing 110. A plurality of connection members 273 may be provided at regular distances on the outer side surface of the lower cover 270. The connection members 273 support the supporting unit 200 inside the chamber 100. In addition, the connection members 273 are connected with the inner wall of the housing 110 such that the lower cover 270 is electrically grounded. A first power source line 223c connected with the first lower power source 223a, a second power source line 225c connected with the second lower power source 225a, the heat transfer medium supplying line 231b connected with the heat transfer medium storing unit 231a, and the cooling fluid supplying line 232c connected with the cooling fluid storing unit 232a extend into the lower cover 270 through the inner space of the connection members 273.

The gas supplying unit 300 supplies process gas into the treatment space inside the chamber 100. The gas supplying unit 300 includes a gas supplying nozzle 310, a gas supplying line 320, and a gas storing unit 330. The gas supplying nozzle 310 is installed at the central portion of the cover 120. The gas supplying nozzle 310 is formed in the bottom surface thereof with a spray port. The spray port is positioned under the cover 120 to supply the process gas into the chamber 100. The gas supplying line 320 connects the gas supplying nozzle 310 with the gas storing unit 330. The gas supplying line 320 is to supply the process gas, which is stored in the gas storing unit 330, to the gas supplying nozzle 310. A valve 321 is installed on the gas supplying line 320. The valve 321 opens or closes the gas supplying line 320 to adjust the flow rate of the process gas supplied through the gas supplying line 320.

The plasma source 400 generates plasma from the process gas supplied into the treatment space. The plasma source 400 may include an inductively coupled plasma (ICP) source. The plasma source 400 includes an antenna chamber 410, an antenna 420, and a plasma power source 430. The antenna chamber 410 is provided in the shape of a cylinder having an open lower portion. The antenna chamber 410 has an inner space. The antenna chamber 410 has a diameter corresponding to that of the chamber 100. The lower end of the antenna chamber 410 is provided detachably from the cover 120. The antenna 420 is provided inside the antenna chamber 410. The antenna 420 is provided in the form of a spiral coil wound in multiple turns and is connected with the plasma power source 430. The antenna 420 receives power from the plasma power source 430. The plasma power source 430 may be positioned outside the chamber 100. The antenna 420 receiving the power may form an electromagnetic field in the treatment space of the chamber 100. The process gas may be transformed to be in the plasma status by the electromagnetic field.

The exhaust unit 500 is interposed between the inner wall of the housing 110 and the supporting unit 200. The exhaust unit 500 includes an exhaust plate 510 having a through hole 511 formed therein. The exhaust plate 510 is provided in the shape of a circular ring. The exhaust plate 510 has a plurality of through holes 511 formed therein. The process gas provided inside the housing 110 is discharged through the exhaust hole 102 after passing through the through holes 511 of the exhaust plate 510. The flow of the process gas may be controlled depending on the shape of the exhaust plate 510 and the shape of the through holes 511.

The temperature control unit 600 adjusts the temperature of the focus ring 240. According to an embodiment, the temperature control unit 600 includes a first heater 610, a second heater 620, a cooling member 630, a temperature measuring member 640, and a controller 650.

The first heater 610 heats the focus ring 240. The first heater 610 is provided in opposition to the focus ring 240 under the focus ring 240.

The second heater 620 is installed at a position opposite to the first heater 610 under the first heater 610. The second heater 620 is interposed between the first heater 610 and the cooling member 630 to minimize the influence on the heating effect of the first heater 610 which is exerted by the cool air of the cooling member 630.

The first heater 610 and the second heater 620 may be provided in the form of spiral coils to generate heat by resisting a current as power is applied. Alternatively, the first heater 610 and the second heater 620 may be provided in the form of various types of heaters to generate heat. For example, the first heater 610 and the second heater 620 may be provided in the form of heating fluid passages through which a heated fluid flows. The first heater 610 and the second heater 620 may be provided in the same type or mutually different types.

The cooling member 630 is installed at a position opposite to the second heater 620 under the second heater 620. According to an embodiment, the cooling member 630 includes a cooling fluid passage 631, a fluid supplying unit 632, and a cooler 633. The cooling fluid passage 631 includes a fluid passage having a cooling fluid flowing therein. The cooler 633 supplies the cooling fluid to the cooling fluid passage 631 to allow the cooling fluid to circulate inside the cooling fluid passage 631. The cooler 633 cools the cooling fluid. The cooler 633 may be provided on a line connecting the cooling fluid passage 631 with the fluid supplying unit 632. Alternatively, the cooler 633 may be provided inside the fluid supplying unit 632. Alternatively, the cooling member 630 may be provided in various types. For example, the cooling member 630 may include a Peltier device. The cooling member 630 cools the focus ring 240. For example, the cooling fluid passage 631 or the Peltier device of the cooling member 630 is provided in the body 260 to be described below to cool the body 260. The body 260 is cooled to cool the focus ring 240 and the edge region of the substrate "W", thereby contributing to the control of the temperature at the edge region of the substrate "W".

The temperature measuring member 640 measures the temperature of the focus ring 240 in real time. According to an embodiment, the temperature measuring member 640 may include a temperature sensor inserted into a position of the inner part of the body 260, which is adjacent to the focus ring 240. For example, when a heat transfer sheet guard is accompanied by the body 260, the temperature sensor may be inserted into the heat transfer sheet guard 290. The temperature measurement value measured by the temperature measuring member 640 is transferred to the controller 650.

The controller 650 controls the first heater 610, the second heater 620, and the cooling member 630 depending on the temperature of the focus ring 240 measured by the temperature measuring member 640. According to an embodiment, the controller 650 may adjust power applied to the first heater 610 and the second heater 620 depending on the temperature of the focus ring 240 measured by the temperature measuring member 640 and may adjust the temperature of an amount of a fluid supplied by the fluid supplying unit 632 and/or the temperature of the cooler 633. For example, when the temperature of the focus ring 240 measured by the temperature measuring member 640 is below a specific temperature range, the controller 650 increases the temperature of the second heater 620 to minimize the influence by the cool air of the cooling fluid inside the cooling fluid passage 631 since a specific time is necessary to increase the temperature of the first heater 610, to reduce an amount of a fluid supplied by the fluid supplying unit 632, to increase the temperature of the cooler 633, and to increase the temperature of the cooling fluid. In addition, when the temperature of the focus ring 240 measured by the temperature measuring member 640 is above a specific temperature range, the controller 650 decreases the temperature of the second heater 620 to lower the temperature of the first heater 610, to increase of the amount of the fluid supplied by the fluid supplying unit 632, to lower the temperature of the cooler 633, and to easily transfer the cool air of the cooling fluid inside the cooling fluid passage 631 to the focus ring 240. Alternatively, the controller 650 may adjust the temperature of the focus ring 240 in various manners.

The body 260 is provided in the shape of a ring opposite to the focus ring 240 under the focus ring 240. The first heater 610, the second heater 620, and the cooling fluid passage 631 of the cooling member 630 or the Peltier device are provided in the body 260. The body 260 may include a dielectric material including at least one of quartz, yttrium oxide ($Y_2O_3$), and alumina ($Al_2O_3$). For example, the body 260 may include any one of quartz, yttrium oxide ($Y_2O_3$), and alumina ($Al_2O_3$).

A heat transfer sheet 280 may be interposed between the focus ring 240 and the body 260. The heat transfer sheet 280 includes a material exhibiting a heat transfer rate higher than that of the body 260. For example, the heat transfer sheet 280 may include silicone (Si). As the heat transfer sheet 280 may be interposed between the focus ring 240 and the body 260, the heat transfer rate is increased between the focus ring 240 and the body 260, thereby facilitating the adjustment of the temperature of the focus ring 240 by using the first heater 610 and the cooling member 630.

The supporting unit 200 may further include the heat transfer sheet guard 290. The heat transfer sheet guard 290 prevents the heat transfer sheet 280 from being damaged or deformed due to plasma. According to an embodiment, the heat transfer sheet guard 290 is provided between the focus ring 240 and the body 260 to surround an inner surface and an outer surface of the heat transfer sheet 280. The heat transfer sheet guard 290 may be provided integrally with the body 260.

Figure 4:
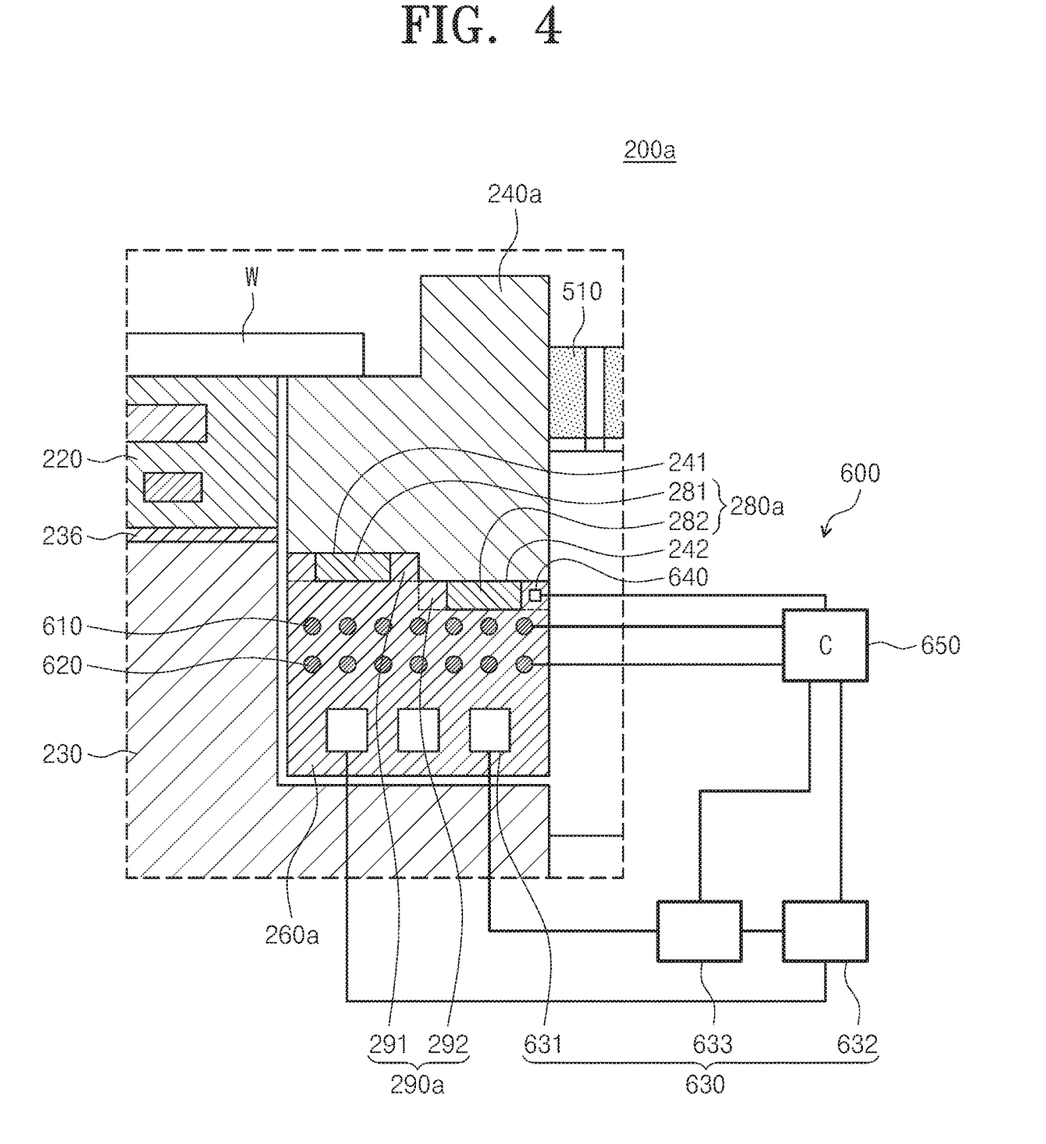
FIG. 4 is a sectional view illustrating a part of a supporting unit, according to another embodiment of the inventive concept.

FIG. 4 is a sectional view illustrating a part of a supporting unit 200a, according to another embodiment of the inventive concept. Referring to FIG. 4, differently from FIG. 3, the shapes of a focus ring 240a and a body 260a and the structures of a heat transfer sheet 280a and a heat transfer sheet guard 290a may be variously provided.

According to an embodiment, the bottom surface of the focus ring 240a is stepped such that the height of an inner region 241 is different from the height of an outer region 242. For example, the inner region 241 may be provided to be higher than the outer region 242.

The top surface of the body 260a is stepped to be engaged with the bottom surface of the focus ring 240a.

The heat transfer sheet 280a includes an inner sheet 281 and an outer sheet 282. The inner sheet 281 is provided in corresponding to the inner region 241.

The outer sheet 282 is provided in corresponding to the outer region 242.

The heat transfer sheet guard 290a includes an inner guard 291 and an outer guard 292. The inner guard 291 is provided to surround an inner surface and an outer surface of the inner sheet 281. The outer guard 292 is provided to surround an inner surface and an outer surface of the outer sheet 282.

Besides, the elements, the structure, and the function of the supporting unit 200a may be the substantially same as those of the supporting unit 200 of FIG. 3.

As described above, according to the apparatus of the inventive concept, the configuration of adjusting the temperature of the focus ring is provided differently from the configuration of adjusting the temperature of the supporting plate, thereby precisely adjusting the temperature of the focus ring. In addition, according to the inventive concept, since the temperature of the edge region of the substrate supported by the focus ring is more precisely adjusted by adjusting the temperature of the focus ring, the treatment may be uniformly performed with respect to the central region and the edge region of the substrate and the reproducibility of the process for the substrate may be improved.

As described above, according to an embodiment of the inventive concept, the apparatus may precisely adjust the temperature of the focus ring.

In addition, according to an embodiment of the inventive concept, the apparatus may uniformly treat the substrate.

Further, according to an embodiment of the inventive concept, the apparatus may enhance the reproducibility of the process for the substrate.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. An apparatus for treating a substrate, the apparatus comprising:
    a chamber having a treatment space configured to treat the substrate;
    a supporting unit configured to support the substrate inside the treatment space;
    a gas supplying unit configured to supply process gas into the treatment space; and
    a plasma source configured to generate plasma based on the process gas inside the treatment space,
    wherein the supporting unit includes,
        a supporting plate configured to receive the substrate;
        a focus ring configured to surround the substrate supported by the supporting plate;
        a temperature control unit configured to adjust a temperature of the focus ring, the temperature control unit includes,
            a first heater configured to heat the focus ring, the first heater under the focus ring and opposite to the focus ring;
            a cooling member under the first heater;
            a heat transfer sheet between the first heater and the focus ring; and
            a second heater at a position opposite to the first heater, between the first heater and the cooling member.

2. The apparatus of claim 1, wherein the supporting unit further comprises:
    a body in a ring shape and under the focus ring, and
    wherein the cooling member is inside the body.

3. The apparatus of claim 2, wherein the first heater and the second heater are in the body.

4. The apparatus of claim 2, wherein the heat transfer sheet is between the focus ring and the body, and has a higher heat transfer rate than a heat transfer rate of the body.

5. The apparatus of claim 4, wherein the supporting unit further comprises:
   a heat transfer sheet guard which surrounds an inner surface of the heat transfer sheet and an outer surface of the heat transfer sheet.

6. The apparatus of claim 5, wherein the heat transfer sheet guard is accompanied by the body.

7. The apparatus of claim 5, wherein
   the focus ring has a bottom surface stepped to make a difference in height between an inner region and an outer region of the bottom surface,
   a top surface of the body is stepped to be engaged with the bottom surface of the focus ring, and
   the heat transfer sheet includes,
      an inner sheet corresponding to the inner region; and
      an outer sheet corresponding to the outer region.

8. The apparatus of claim 7, wherein the heat transfer sheet guard comprises:
   an inner guard which surrounds an inner surface and an outer surface of the inner sheet; and
   an outer guard which surrounds an inner surface and an outer surface of the outer sheet.

9. The apparatus of claim 2, wherein the temperature control unit comprises:
   a temperature measuring member configured to measure the temperature of the focus ring; and
   a controller configured to control the first heater, the second heater, and the cooling member depending on the temperature measured by the temperature measuring member.

10. The apparatus of claim 9, wherein
the controller is configured to increase a temperature of the first heater, increase a temperature of the cooling member, and increase a temperature of the second heater based on the temperature of the focus ring being below a specific temperature range, the temperature measuring member being configured to measure the temperature of the focus ring; and
the controller is configured to decrease the temperature of the first heater, decrease the temperature of the cooling member, and decrease the temperature of the second heater, based on the temperature of the focus ring being above a specific temperature range, the temperature measuring member being configured to measure the temperature of the focus ring.

11. The apparatus of claim 2,
wherein the focus ring includes,
   at least one material of silicon (Si), silicon carbide (SiC), quartz, yttrium oxide ($Y_2O_3$), and alumina ($Al_2O_3$), and
wherein the body includes,
   at least one material of quartz, yttrium oxide ($Y_2O_3$), and alumina ($Al_2O_3$).

\* \* \* \* \*